United States Patent [19]
Huang et al.

[11] Patent Number: 5,694,436
[45] Date of Patent: Dec. 2, 1997

[54] GAIN CONTROL SYSTEM FOR HANDLING PERIODIC NOISES

[75] Inventors: Shih-Wei Huang, Taipei; Yu-Heng Hsueh, Feng Shan, both of Taiwan

[73] Assignee: Chaw Khong Co., Ltd., Taipei County, Taiwan

[21] Appl. No.: 505,833

[22] Filed: Jul. 21, 1995

[51] Int. Cl.$^6$ .......................... H04L 27/06; H04M 11/04
[52] U.S. Cl. .......................... 375/345; 375/355; 330/278; 340/310.04; 340/310.08; 455/234.2
[58] Field of Search .......................... 375/345, 354–355; 330/127, 278–279; 364/715.01; 340/310.01, 310.03, 310.04, 310.08, 538; 455/234.1, 234.2; 381/94, 107–108; 348/607

[56] References Cited

U.S. PATENT DOCUMENTS

| | | | |
|---|---|---|---|
| 4,703,507 | 10/1987 | Holden | 381/94 |
| 4,745,392 | 5/1988 | Ise et al. | 340/310.03 |
| 4,747,065 | 5/1988 | West | 375/345 X |
| 4,859,964 | 8/1989 | Jorgensen | 330/279 |
| 4,947,133 | 8/1990 | Thomas | 327/100 |
| 5,016,205 | 5/1991 | Shumway | 375/345 X |
| 5,187,809 | 2/1993 | Rich et al. | 375/345 X |
| 5,227,762 | 7/1993 | Guidette et al. | 340/310.03 |
| 5,267,272 | 11/1993 | Cai et al. | 375/345 |
| 5,267,322 | 11/1993 | Smith et al. | 381/107 |
| 5,276,685 | 1/1994 | Kepler et al. | 370/332 |
| 5,329,243 | 7/1994 | Tay | 330/136 |
| 5,355,114 | 10/1994 | Sutterline et al. | 340/310.03 |
| 5,379,445 | 1/1995 | Arnstein et al. | 455/13.4 |
| 5,436,933 | 7/1995 | Andruzzi, Jr. | 375/345 |
| 5,442,648 | 8/1995 | DuBose et al. | 370/424 |
| 5,493,712 | 2/1996 | Ramesh et al. | 455/234.2 |

*Primary Examiner*—Young T. Tse
*Attorney, Agent, or Firm*—The Kline Law Firm, P.C.

[57] ABSTRACT

This invention relates to a gain control system for handling periodic noises to facilitate receiving of data signals in a noisy environment such as a powerline. The gain control system includes a period detector for detecting periods of the periodic noises and generating a SYNC signal for each detected period; a signal converter for digitizing the input signals; signal analyzing means for analyzing the digitized input signals received between two SYNC signals and generating a gain control table for flattening the periodic noises contained between two SYNC signals; a gain controller for amplifying the input signals; and a control signal generator for generating a sequence of gain control signals according to the gain control table after each SYNC signal to control the gain controller whereby the periodic noises contained between each pair of SYNC signals are flattened by the gain controller. The gain control system of the present invention can effectively catch and amplify those periodic noises without using real time monitoring and real time feed back techniques and thus can greatly reduce the implementation and operational costs of a traditional digital gain control system used in the same environment.

18 Claims, 4 Drawing Sheets

5,694,436

GAIN CONTROL SYSTEM FOR HANDLING PERIODIC NOISES

BACKGROUND OF THE INVENTION

1. Field of the Invention

This invention relates to a gain control system, and more particularly, to a gain control system for handling periodic noises to facilitate receiving of data signals in a noisy environment such as a powerline.

2. Description of the Prior Art

Powerline communications is an important field of data communications. Many techniques have been developed to facilitate data communications in this complex environment. A powerline communication system is usually characterized by many types of big and complex noises such as spikes, interferences, channel attenuation, etc. Most of the powerline noises are generated by equipments attached to the powerline and the frequencies of these noises are mostly synchronous with the AC (alternating current) power in the powerline. These noises coupled with the AC power create a lot of impairments and thus make it very difficult for transmitting data signals.

In such a complex environment, traditional analog-based gain controllers are not suitable for handling such powerline data communications because they can't adjust the gain of an amplifier dynamically to handle quick variations caused by those periodic noises. Digital-based gain controllers can provide more dynamic and complex gain control capabilities in amplifying various electronic signals when coupled with various signal analysis and gain control algorithms. But in order to handle data communications in a powerline environment which comprises a lot of strong periodic noises, a traditional digital gain control system requires complex real time monitoring and real time feedback capabilities. The hardware and software costs of such digital gain control systems are very expensive and require highly sophisticated implementation and operational skills. Besides, traditional digital gain control systems seldom take the advantage of the periodic characteristics of such noise environment.

SUMMARY OF THE INVENTION

It is therefore the goal of the present invention, by overcoming the limits of the prior art, to devise a new gain control system for handling periodic noises in a noisy environment such as a powerline to achieve the following objects:

1. To provide a new solution in handling periodic noises.
2. To provide a low cost solution in minimizing the effect caused by the periodic noises.

Briefly, in a preferred embodiment, the present invention includes a gain control system for handling periodic noises contained within input signals comprising:

(1) a period detector for detecting periods of the periodic noises and generating a SYNC signal for each detected period;

(2) a signal converter for digitizing the input signals;

(3) signal analyzing means for analyzing the digitized input signals received after a plurality of SYNC signals and generating a gain control table for flattening the periodic noises contained between two SYNC signals;

(4) a gain controller for amplifying the input signals;

(5) a control signal generator for generating a sequence of gain control signals according to the gain control table after each SYNC signal to control the gain controller whereby the periodic noises contained between each pair of SYNC signals are flattened by the gain controller.

It is an advantage of the present invention that it provides a new solution in handling periodic noises. The periodic noises are flattened by the gain controller to facilitate further processing of the input signals. If there are data signals contained within the amplified signals after the gain control system starts amplifying the input signals to flatten the periodic signals, it will be much easier to detect the data signals contained within the amplified signals.

It is another advantage of the present invention that by using a period detector to synchronize the sampling and gain control of the periodic noises, the gain control system of the present invention can effectively catch and amplify those periodic noises without using real time monitoring and real time feed back techniques. Its implementation and operational costs can thus be greatly reduced when compared with a traditional digital gain control system used in the same environment.

These and other objects and the advantages of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
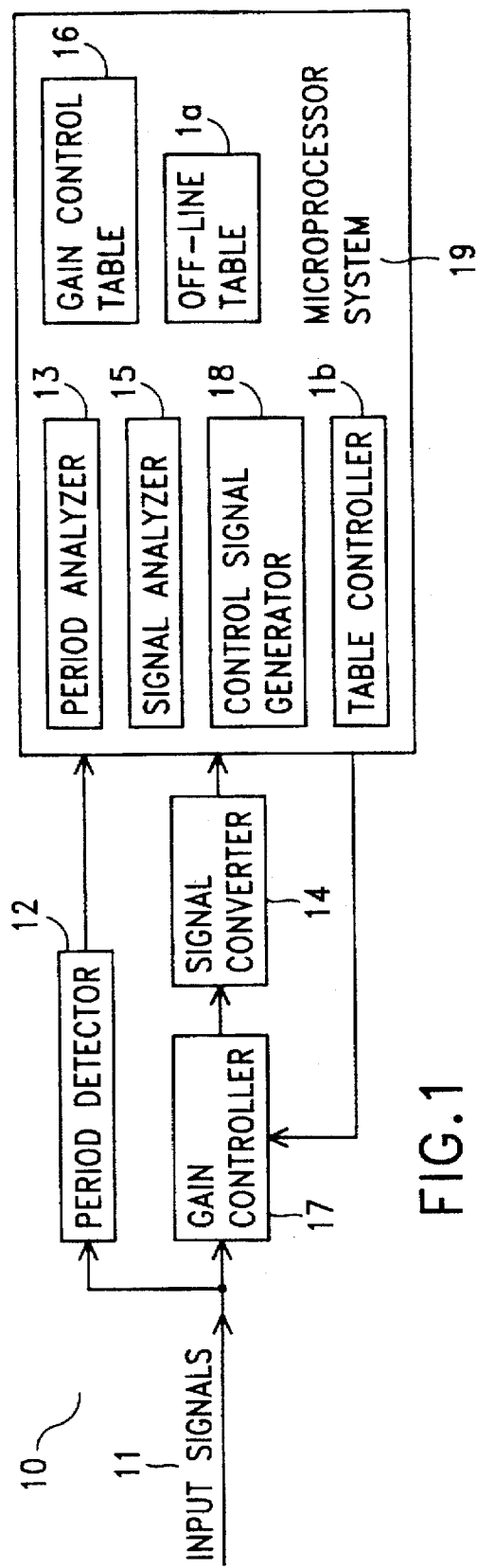
FIG. 1 is a block diagram of a gain control system for handling periodic noises according to the present invention.

FIG. 1 is a block diagram of a gain control system 10 for handling periodic noises contained with input signals according to the present invention. The gain control system 10 comprises:

(1) a synchronization means having a period detector 12 and a period analyzer 13 for sensing the periods of the periodic noises and generating SYNC signals which are synchronous with the periodic noises; the period detector 12 is used for detecting periods of the periodic noises contained within the input signals 11 and the period analyzer 13 will analyze the detected periods and generating the SYNC signals;

(2) a gain controller 17 for amplifying the input signals 11;

(3) a signal converter 14 for digitizing the input signals 11 amplified by the gain controller;

(4) a signal analyzer 15 for analyzing the digitized input signals received after a plurality of SYNC signals and generating a gain control table 16 for flattening the periodic noises contained between two SYNC signals;

(5) a control signal generator 18 for generating a sequence of gain control signals according to the gain control table 16 after each SYNC signal to control the gain controller 17 whereby the periodic noises contained between each pair of SYNC signals are flattened by the gain controller 17.

Part of the gain control system 10 is implemented in a microprocessor system 19. The period analyzer 13, signal analyzer 15, and control signal generator 18 are three software programs executed by the system 19 to perform some specific functions. The gain control table 16 generated by the signal analyzer 15 is also stored in the system 19 for direct access.

The system 10 further comprises a plurality of off-line tables 1a and a table controller 1b. The table controller 1b is used to replace the gain control table 16 with one specific off-line table 1a to save the time for generating a new gain control table when a specific event happens. From the field experiences, periodic noises occur after certain routine events may look very similar. For example, if certain equipments are turned on at 6 AM every morning, the periodic noises occurred in the powerline after 6 AM everyday may bear great resemblances. Since it takes a while to establish a new gain control table when periodic noises in a powerline are suddenly changed by an event, an off-line table prepared by analyzing some gain control tables previously generated by the same event may be used to replace an existing gain control table when the event happens so that the time for generating a new gain control table for the specific event can be saved. After the existing gain control table 16 is replaced by an offline table 1a, the system 10 still can generate a new gain control table in parallel so that it can be used later on.

Figure 2:
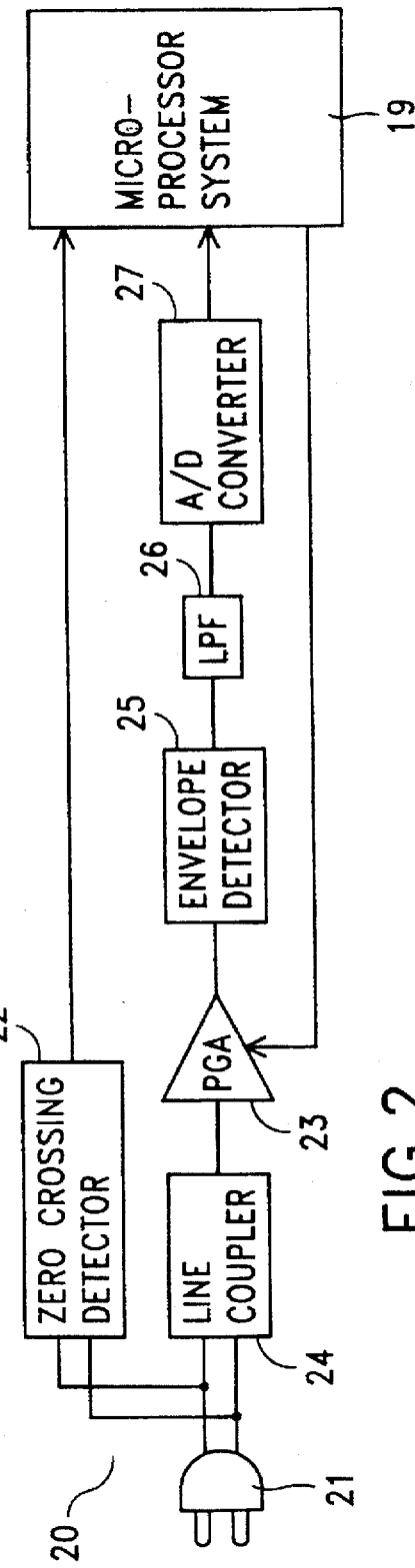
FIG. 2 shows a gain control circuit of the gain control system shown in FIG. 1 for receiving amplitude-shift-keying (ASK) input signals.

FIG. 2 shows a gain control circuit 20 of the gain control system 10 for receiving amplitude-shift-keying (ASK) signals. The circuit 20 comprises a plug 21 for connecting a powerline (not shown) to receive input signals transmitted through the powerline. A zero crossing detector (ZCD) 22 connected to the plug 21 is used for detecting zero crossing points of the powerline. The ZCD 22 is correspondent to the period detector 12 in FIG. 1. A line coupler 24 is used for coupling input signals to a programmable gain control amplifier (PGA) 23 which is controlled by a microprocessor system 19. After the input signals are amplified by the PGA 23, an envelope detector 25 is used for demodulating input ASK signals into baseband data signals. The baseband data signals are passed to an anti-aliasing low pass filter (LPF) 26, analog-to-digital (A/D) convertor 27 and then the microprocessor system 19 in order. Refer to both FIGS. 1 and 2, the period detector 12 of system 10 is implemented as the ZCD 22 in system 20 and the signal converter 14 is implemented by as the envelope detector 25, low pass filter 26 and A/D converter 27.

Figure 3:
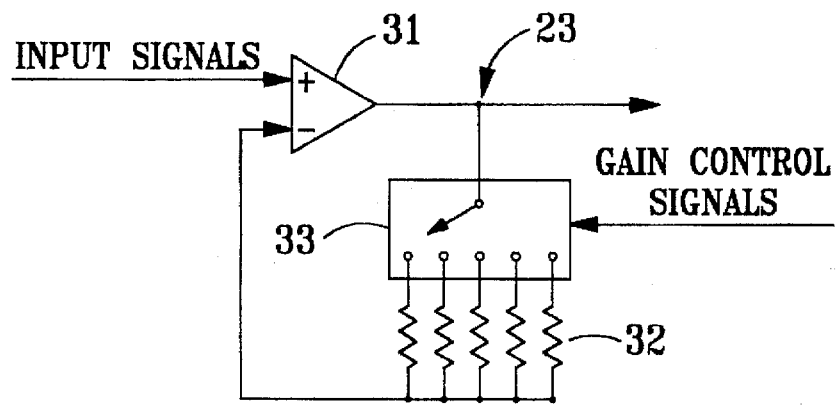
FIG. 3 shows a circuit diagram of a programmable gain control amplifier.

FIG. 3 shows a circuit diagram of the PGA 23 shown in FIG. 2. The circuit comprises an operational amplifier 31, a resistor network 32 and a multiplexer 33 connected to the resistor network 32 for controlling the gain of the amplifier. The multiplexer 33 is controlled by gain control signals transmitted from the microprocessor system 19.

Figure 4:
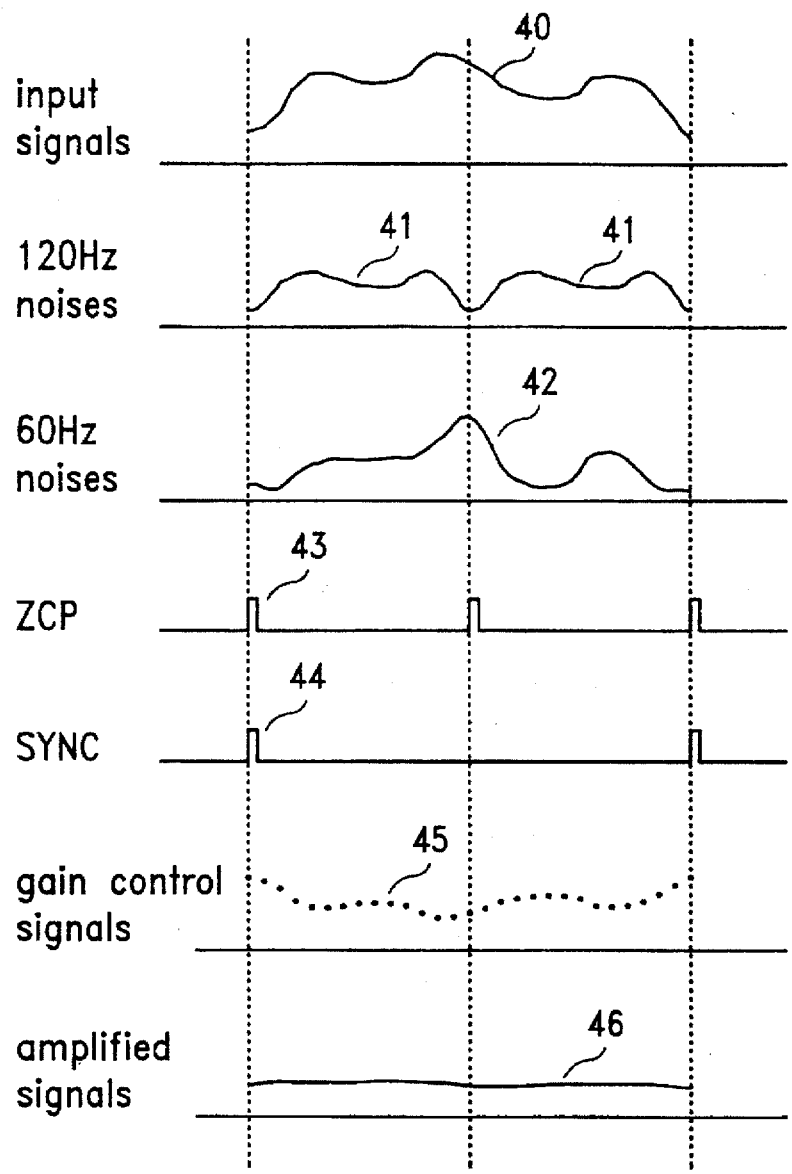
FIG. 4 shows the timing diagrams of periodic noises before and after the gain control system.

Please refer to FIG. 4. FIG. 4 shows a single period of a periodic noise 40 commonly received from a powerline. The periodic noise 40 comprises two periodic noises in it: a 60 Hz periodic noise 42 and two 120 Hz periodic noises 41. This is commonly seen in the powerline environment. Frequencies of the periodic noises generated by equipments attached to a 60 Hz AC powerline are usually equal to 60 Hz or its multiplicity. Since the 60 Hz noise 42 has the longest period, the period of the periodic noise 40 is equal to the period of the 60 Hz periodic noise 42 when the 60 Hz noise 42 and the two 120 Hz noises 41 are coupled together. The ZCD 22 detects the zero crossing points (ZCP) of the 60 Hz AC powerline and generates a ZCP signal 43 when a zero crossing point of the 60 Hz AC is detected. Since each zero crossing point of the powerline is correspondent to a period of the 120 Hz noise 41 ($\frac{1}{120}$ second) and the period of the periodic noise 40 is equal to two periods of the noises 41, a SYNC signal 44 is issued for every two ZCP signals 43. The period analyzer 13 which generates the SYNC signals 44 works as a counter in counting the number of ZCP signals 43 and generates a SYNC signal 44 for every two ZCP signals. If the hardware circuit of the ZCD 22 can count and generate a signal for each 60 Hz period instead of for each 120 Hz period, the signal generated by the ZCD can then be used as the SYNC signal directly by the microprocessor system 19. In this case the period analyzer 13 can be erased from the system 19 because its function has been implemented by the ZCD hardware.

After the SYNC signals 44 are generated, the signal analyzer 15 analyzes the digitized input signals received between two consecutive SYNC signals 44 for a plurality of cycles to generate the gain control table 16. The periodic noise 40 contained between two SYNC signals 44 are estimated first by the signal analyzer 15 and then a sequence of gain control values for flattening the estimated periodic noises are calculated and stored in the gain control table 16. The detail of this process will be introduced in FIG. 6. Once the gain control table 16 is created, the control signal generator 18 will start generating a sequence of gain control signals 45 by using the gain control table 16 after each SYNC signal 44. The programmable gain control amplifier 23 will then use these gain control signals 45 to flatten the periodic noise 40 to a predetermined noise floor 46.

Figure 5:
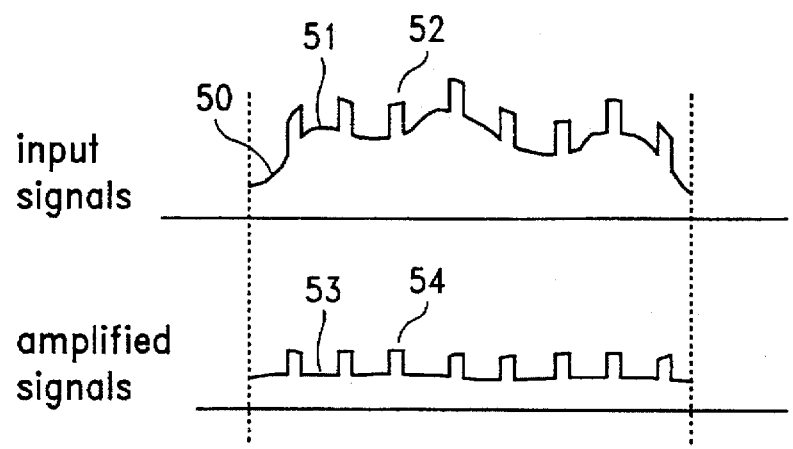
FIG. 5 shows the input signals which comprise periodic noises and data signals 52 before and after the gain control system.

Please refer to FIG. 5. When the control signal generator 18 starts using the gain control table 16 to flatten the periodic noises 40 from the input signals, digital signals contained within the input signals can easily be detected from the amplified signals. FIG. 5 shows a period of an input signal 50 which comprises a periodic noise 51 and a plurality of data signals 52 riding on top of the periodic noise 51. The periodic noise 51 is the same as the periodic noise 41. After the periodic noise 51 is flattened to a predetermined noise floor 53 as shown in the timing diagram of the amplified signals, the data signals 52 on top of the periodic noise 51 are also amplified and become the amplified data signals 54. Compared with the timing diagrams of the input signals and the amplified signals, it can easily be seen that the amplified data signals 54 riding on top of the noise floor 53 can much easily be detected by using traditional techniques.

Figure 6:
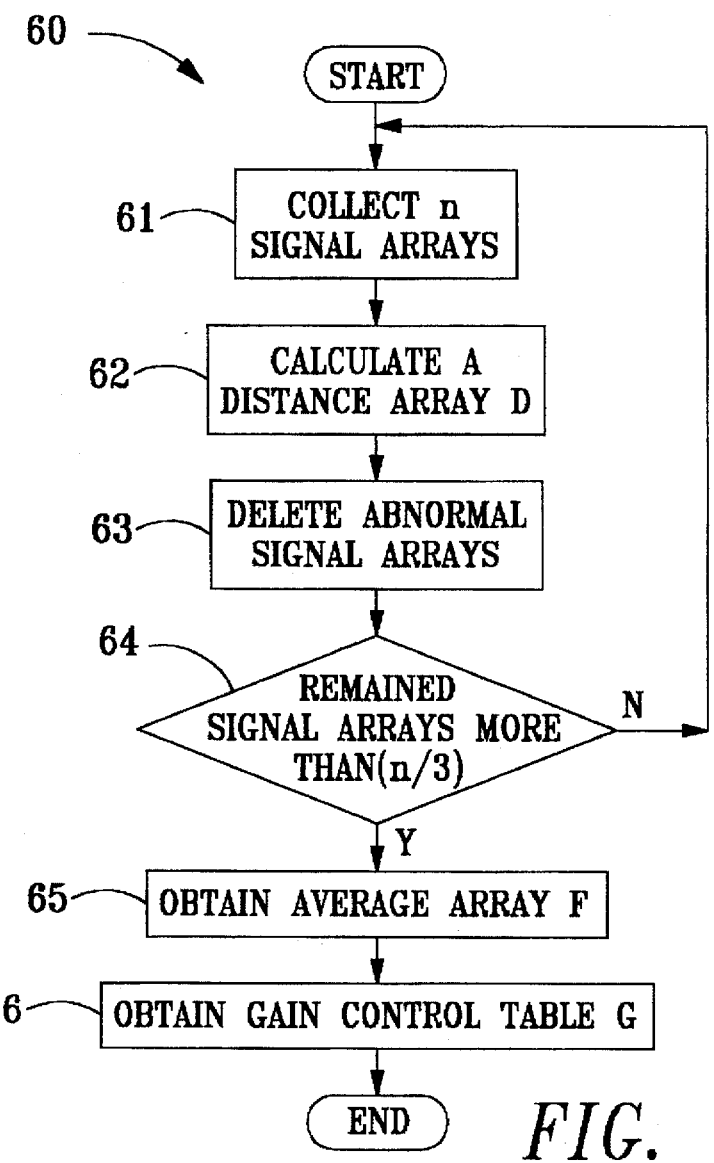
FIG. 6 shows a process for establishing a gain control table.

FIG. 6 shows a process 60 for establishing a gain control table. One period is defined as the period between two SYNC signals in this process. All the digitized input signals received between two SYNC signals at the ith period are represented as a signal array $S_i$ and the symbol $S_i(j)$ means the jth digitized input signals of the signal array $S_i$. The process 60 comprises the following steps:

step 61 Collect a predetermined number (n) of signal arrays $S_1$ to $S_n$;

step 62 Calculate a distance array D of dimension (n×n) wherein D(i,j) represents the distance between two signal arrays $S_i$ and $S_j$ and t is the maximum number of digitized input signals of all the signal arrays from $S_1$ to $S_n$:

$$D(i,j) = D(j,i) = \sqrt{\sum_{k=1}^{t} (S_i(k) - S_j(k))^2}$$

step 63 Delete a signal array $S_i$ if more than half (n/2) of the distances D(i,j), j=1 . . . n are larger than a predetermined distance X;

step 64 If the number (r) of remained signal arrays is smaller than a predetermined limit, say (n/3), go back to step 61;

step 65 Obtain an average array F of all the remained signal arrays $S_i$, i=1 . . . r:

$$F(j) = \frac{\sum_{i=1}^{r} S_i(j)}{r}$$

step 66 Obtain a gain control table G by using the average array F:

$$G(i) = \frac{L * g}{F(i)}$$

The value L represents the predetermined noise floor 46 and g is the value of the gain controller 17 which is fixed during the process 60. If an existing gain control table $G_0$ is in use during the process 60, the formula used in step 66 will become:

$$G(i) = \frac{L * G_0(i)}{F(i)}$$

The process 60 uses a predetermined distance X as a filter to select a group of signal arrays which are closely "located" together. That means all these selected signal arrays bear great similarity in their shapes (periodic noises). Signal arrays which are different from more than half of other signal arrays are deleted. If the number of remained signal arrays is more than a predetermined limit (n/3) which represents a user-defined confidence level of the effective (remained) signal arrays, an average array F will be generated as an estimate of the periodic noises contained in each period. A gain control table G is generated by using the average array F. Since all the digitized input signals are already amplified by the gain controller 17, the gain factor g (fixed gain) or $G_0$ (existing gain control table) must be eliminated from the average F in step 66. Process 60 presents one method in estimating the periodic noises contained within the digitized input signals. Other methods can also be used by the gain control system 10 to estimate the periodic noises.

The gain control table 16 shown in FIG. 1 is the most important element for controlling the gain controller 17 for flattening the periodic noises. A gain control table can be established by constantly analyzing the digitized input signals by the signal analyzer 15, or can be passively generated by the signal analyzer 15 by a request from other system which can sense the noise condition within the amplified signals. Since the periodic noises in a powerline system tend to exist for quite a while, there is usually no need to keep on analyzing the digitized input signals because it may consume a lot of computing power. The signal analyzer 15 can be turned off after one gain control table 16 is generated and activated later on for generating a new gain control table.

Figure 7:
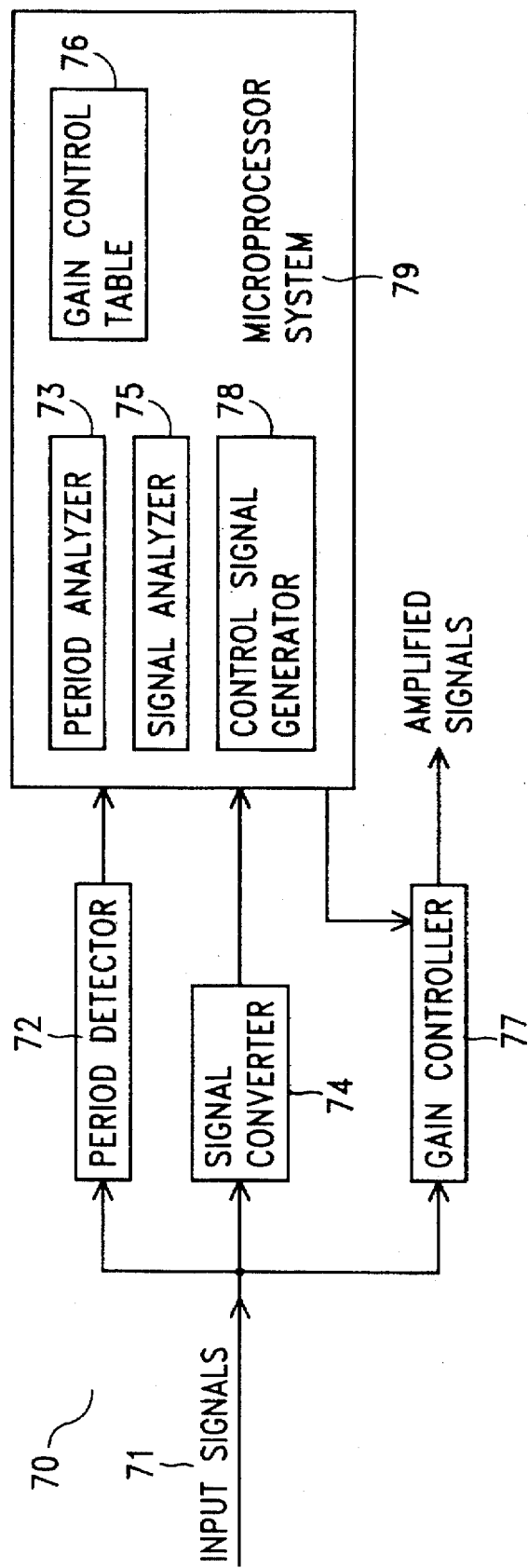
FIG. 7 is a block diagram of an alternative gain control system according to the present invention.

FIG. 7 is a block diagram of an alternative gain control system 70 according to the present invention. The system 70 comprises:

(1) a synchronization means having a period detector 72 and a period analyzer 73 for sensing the periods of the periodic noises and generating a plurality of SYNC signals which are synchronous with the periodic noises; the period detector 72 is used for detecting periods of the periodic noises contained within the input signals 71 and the period analyzer 73 will further analyze the detected periods and generating a plurality of SYNC signals which are synchronous with the periodic noises;

(2) a signal converter 74 for digitizing the input signals 71;

(3) a signal analyzer 75 for analyzing the digitized input signals received after a plurality of SYNC signals and generating a gain control table 76 for flattening the periodic noises contained between two SYNC signals;

(4) a gain controller 77 for amplifying the input signals 71;

(5) a control signal generator 78 for generating a sequence of gain control signals by using the gain control table 76 after each SYNC signal to control the gain controller 77 whereby the periodic noises contained between two SYNC signals are flattened by the gain controller 77.

The difference between the gain control system 70 and the system 10 is that the gain controller 17 is located ahead of the signal converter 14 which forms a feedback look while the gain controller 77 is in parallel with the signal converter 74. The amplified signals generated by the gain controller 17 can be measured by the microprocessor system 19 but the microprocessor 79 of the system 70 can not reach the amplified signals generated by the gain controller 77 and thus has no way to measure and adjust them.

The process 60 can also be used by the system 70 to establish a gain control table 76. The gain control table G in step 66 can be obtained by using the following formula:

$$G(j) = \frac{L}{F(j)}$$

The above disclosure is not intended as limiting. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A gain control system for handling periodic noises contained within input signals comprising:

(1) synchronization means for sensing periods of the periodic noises and generating SYNC signals which are synchronous with the periodic noises;

(2) a signal converter for digitizing the input signals;

(3) signal analyzing means for analyzing the digitized input signals received after a plurality of SYNC signals and generating a gain control table for flattening the periodic noises contained between two SYNC signals;

(4) a gain controller for amplifying the input signals;

(5) a control signal generator for generating gain control signals according to the gain control table after each SYNC signal to control the gain controller whereby the periodic noises contained between each pair of SYNC signals are flattened by the gain controller.

2. The gain control system of claim 1 wherein the synchronization means comprises a period detector for detecting periods of the periodic noises and a period analyzer for analyzing the detected periods and generating the SYNC signals.

3. The gain control system of claim 2 wherein the input signals are received from a powerline and wherein the period detector comprises a zero crossing detector for detecting zero crossing points of the powerline.

4. The gain control system of claim 3 wherein the period analyzer generates one SYNC signal for every two detected zero crossing points generated by the zero crossing detector.

5. The gain control system of claim 1 wherein the input signals are received from a powerline and wherein the synchronization means comprises a zero crossing detector for detecting zero crossing points of the powerline and generating one SYNC signal for each detected zero crossing point.

6. The gain control system of claim 1 wherein the signal analyzing means is turned off after the gain control table is generated.

7. The gain control system of claim 6 further comprising one off-line table and a table control means for replacing the gain control table with the off-line table.

8. The gain control system of claim 1 wherein the signal analyzer estimates the periodic noises contained between two SYNC signals first from the received digitized input signals and generates the gain control table according to the estimated periodic noises.

9. The gain control system of claim 1 wherein the signal converter is attached behind the gain controller for digitizing the input signals amplified by the gain controller.

10. The gain control system of claim 1 wherein the signal converter is in parallel with the gain controller and the input signals are directly digitized by the signal converter.

11. The gain control system of claim 1 wherein the signal converter further comprises a demodulator means for demodulating the input signals before digitizing the input signals.

12. A gain control method for handling periodic noises contained within input signals, the gain control method comprising the steps of:

(1) detecting periods of the periodic noises and generating a plurality of SYNC signals which are synchronous with the periodic noises;

(2) digitizing the input signals;

(3) analyzing the digitized input signals received after a plurality of SYNC signals and generating a gain control table for flattening the periodic noises contained between two SYNC signals;

(4) generating a sequence of gain control signals according to the gain control table after each SYNC signal to control a gain controller which is used for amplifying the input signals whereby the periodic noises contained between two SYNC signals are flattened by the gain controller.

13. The gain control method of claim 12 wherein the input signals are received from a powerline and the SYNC signal is generated when each zero crossing point of the powerline is detected.

14. The gain control method of claim 12 wherein the input signals are received from a powerline and the SYNC signal is generated when every two zero crossing points of the powerline are detected.

15. The gain control method of claim 12 wherein the SYNC signal is generated when a predetermined number of periods of the periodic noises are detected.

16. The gain control method of claim 12 wherein the received digitized input signals in step (3) are used to estimate the periodic noises contained between two SYNC signals first and the gain control table is generated according to the estimated periodic noises.

17. The gain control method of claim 12 wherein the input signals are demodulated first before being digitized in step (2).

18. A gain control system for handling periodic noises contained within input signals comprising:

(1) synchronization means for sensing periods of the periodic noises and generating SYNC signals which are synchronous with the periodic noises;

(2) a signal converter for converting the input signals;

(3) signal analyzing means for analyzing the converted input signals received after a plurality of SYNC signals and generating a gain control table for flattening the periodic noises contained between two SYNC signals;

(4) a gain controller for amplifying the input signals;

(5) a control signal generator for generating gain control signals according to the gain control table after each SYNC signal to control the gain controller whereby the periodic noises contained between each pair of SYNC signals are flattened by the gain controller.

* * * * *